(12) United States Patent
Wang et al.

(10) Patent No.: US 8,080,732 B2
(45) Date of Patent: Dec. 20, 2011

(54) ELECTRONIC DEVICE

(75) Inventors: Jun Wang, Shenzhen (CN); Chen-Li Kao, Taipei Hsien (TW); Deng-Zhong Chen, Shenzhen (CN); Chien-Ming Chih, Taipei Hsien (TW)

(73) Assignees: Hong Fu Jin Precision Industry (ShenZhen) Co., Ltd., Shenzhen, Guangdong Province (CN); Hon Hai Precision Industry Co., Ltd., Tu-Cheng, New Taipei (TW)

( * ) Notice: Subject to any disclaimer, the term of this patent is extended or adjusted under 35 U.S.C. 154(b) by 247 days.

(21) Appl. No.: 12/644,323

(22) Filed: Dec. 22, 2009

(65) Prior Publication Data
US 2011/0090622 A1    Apr. 21, 2011

(30) Foreign Application Priority Data
Oct. 16, 2009   (CN) .......................... 2009 1 0308352

(51) Int. Cl.
*H02G 3/08* (2006.01)

(52) U.S. Cl. ......... 174/50; 174/17 R; 439/535; 248/906; 361/600

(58) Field of Classification Search ............... 174/50, 174/17 R; 439/535; 220/4.02; 361/600; 248/906
See application file for complete search history.

(56) References Cited

U.S. PATENT DOCUMENTS 7,816,603 B2 * 10/2010 Nowakowski ............... 174/50
7,825,334 B2 * 11/2010 Chien .......................... 174/50
7,843,684 B2 * 11/2010 Lu et al. .................. 361/679.47

* cited by examiner

*Primary Examiner* — Dhiru R Patel
(74) *Attorney, Agent, or Firm* — Altis Law Group, Inc.

(57) ABSTRACT

An electronic device includes a first housing, a second housing, and a buffering member. The first housing has a first flange, and the second housing has a second flange. The buffering member is positioned between the first housing and the second housing. The buffering member includes a first buffering portion and a second buffering portion. The first buffering portion is positioned between the first housing and the second housing and separates the first and second housings. The second buffering portion protrudes between the first flange and the second flange.

12 Claims, 5 Drawing Sheets

ELECTRONIC DEVICE

BACKGROUND

1. Technical Field

The present disclosure relates generally to electronic devices and, more particularly, to an electronic device with a buffering structure.

2. Description of Related Art

An electronic device contains a plurality of inner electronic components therein. The electronic device frequently utilizes a soft plastic outer housing for dampening shocks from falls or collisions, thus avoiding damage to the inner electronic components. However, the plastic outer housing is often visually unappealing, and is inconvenient to handle. In addition, the inner electronic components of the electronic device facing possible damage from overheating because the plastic outer housing hampers effective heat dispersion.

Therefore, there is room for improvement within the art.

BRIEF DESCRIPTION OF THE DRAWINGS

The components in the drawings are not necessarily drawn to scale, the emphasis instead being placed upon clearly illustrating the principles of the present disclosure. Moreover, in the drawings, like reference numerals designate corresponding parts throughout the several views.

DETAILED DESCRIPTION

Figure 1:
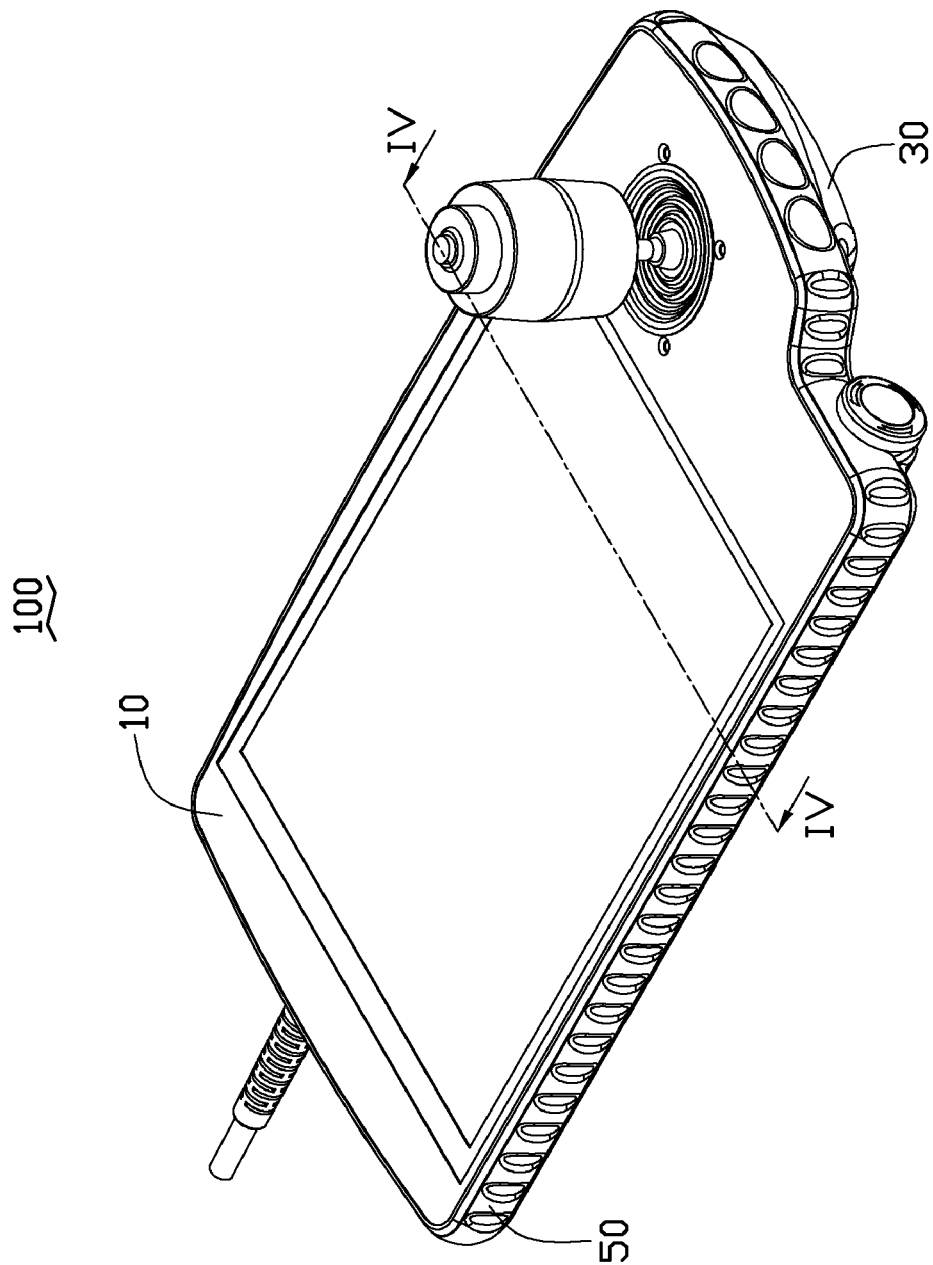
FIG. 1 is an isometric view of an embodiment of an electronic device.

Referring to FIG. 1, an embodiment of an electronic device 100 includes a first housing 10, a second housing 30, and a buffering member 50 positioned between the first housing 10 and the second housing 30. In the illustrated embodiment, the electronic device 100 is a teaching pendant or controller.

Figure 2:
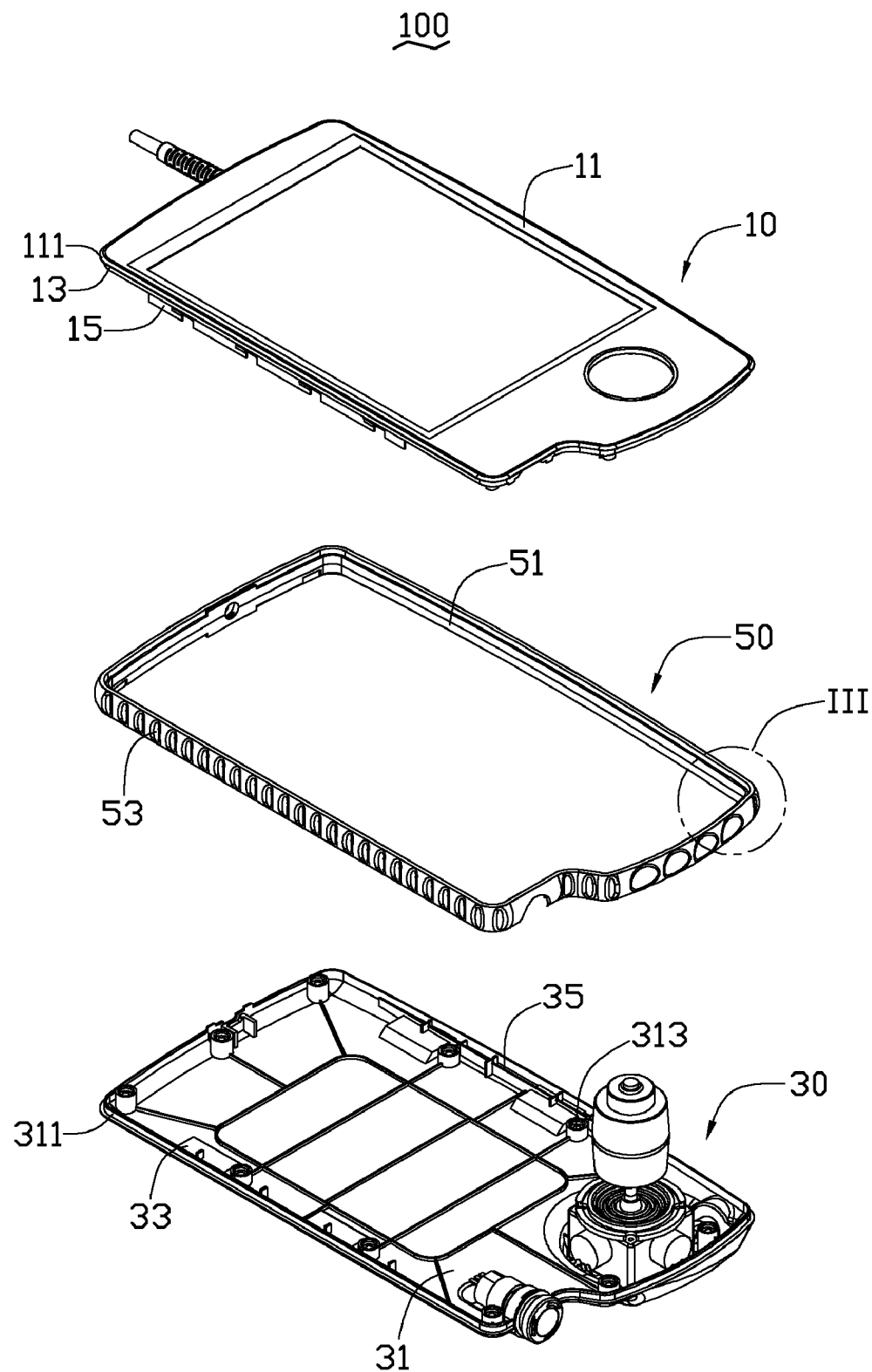
FIG. 2 is an exploded, isometric view of the electronic device of FIG. 1.

Referring to FIGS. 1 and 2, the first housing 10 includes a first bottom wall 11, a first sidewall 13, and a first engaging portion 15. The first sidewall 13 extends substantially perpendicularly from an edge of the first bottom wall 11. The first engaging portion 15 also extends from the first bottom wall 11 adjacent to the first sidewall 13. The first bottom wall 11 has a first flange 111 with a curved outer surface. The first bottom wall 11 defines a plurality of threaded holes (not shown).

The second housing 30 includes a second bottom wall 31, a second sidewall 33, and a second engaging portion 35. The second sidewall 33 extends substantially perpendicularly from an edge of the second bottom wall 31. The first engaging portion 15 also extends from the second bottom wall 31 adjacent to the second sidewall 33. The second bottom wall 31 has a second flange 311, and the second flange 311 has a curved outer surface. The second bottom wall 31 defines a plurality of threaded holes 313.

Referring to FIGS. 2 through 5, the buffering member 50 is annular and encircles the first housing 10 and the second housing 30. The buffering member 50 can be made of an elastic material, such as soft plastic. The buffering member 50 includes a first buffering portion 51 and a second buffering portion 53. The first buffering portion 51 and the second buffering portion 53 cooperatively define a first assembly groove 55 and a second assembly groove 57. The first buffering portion 51 includes a connecting protrusion 511 and a positioning flange 513. The connecting protrusion 511 extends from a middle portion of the second buffering portion 53. The positioning flange 513 is formed on an end of the connecting protrusion 511 away from the second buffering portion 53. The connecting protrusion 511 separates the first assembly groove 55 from the second assembly groove 57. The second buffering portion 53 has a curved outer surface 531.

Figure 3:
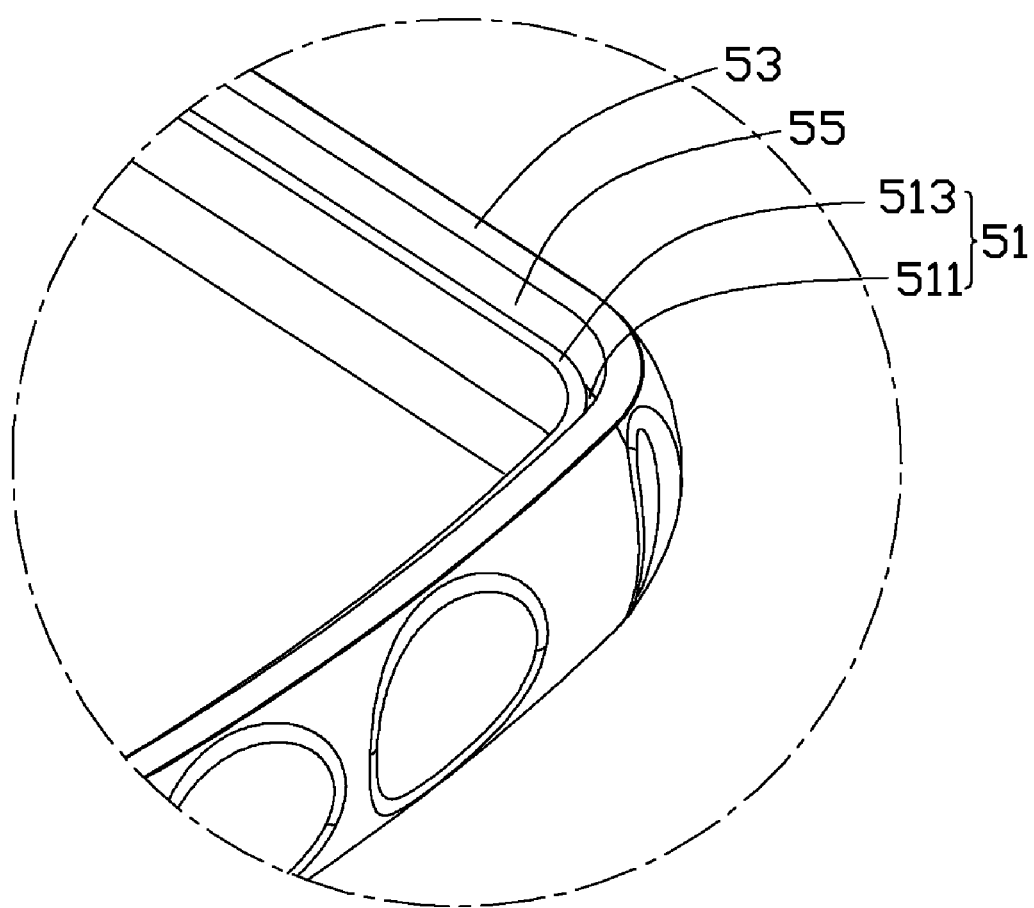
FIG. 3 is an enlarged view of a part III of FIG. 2.
Figure 4:
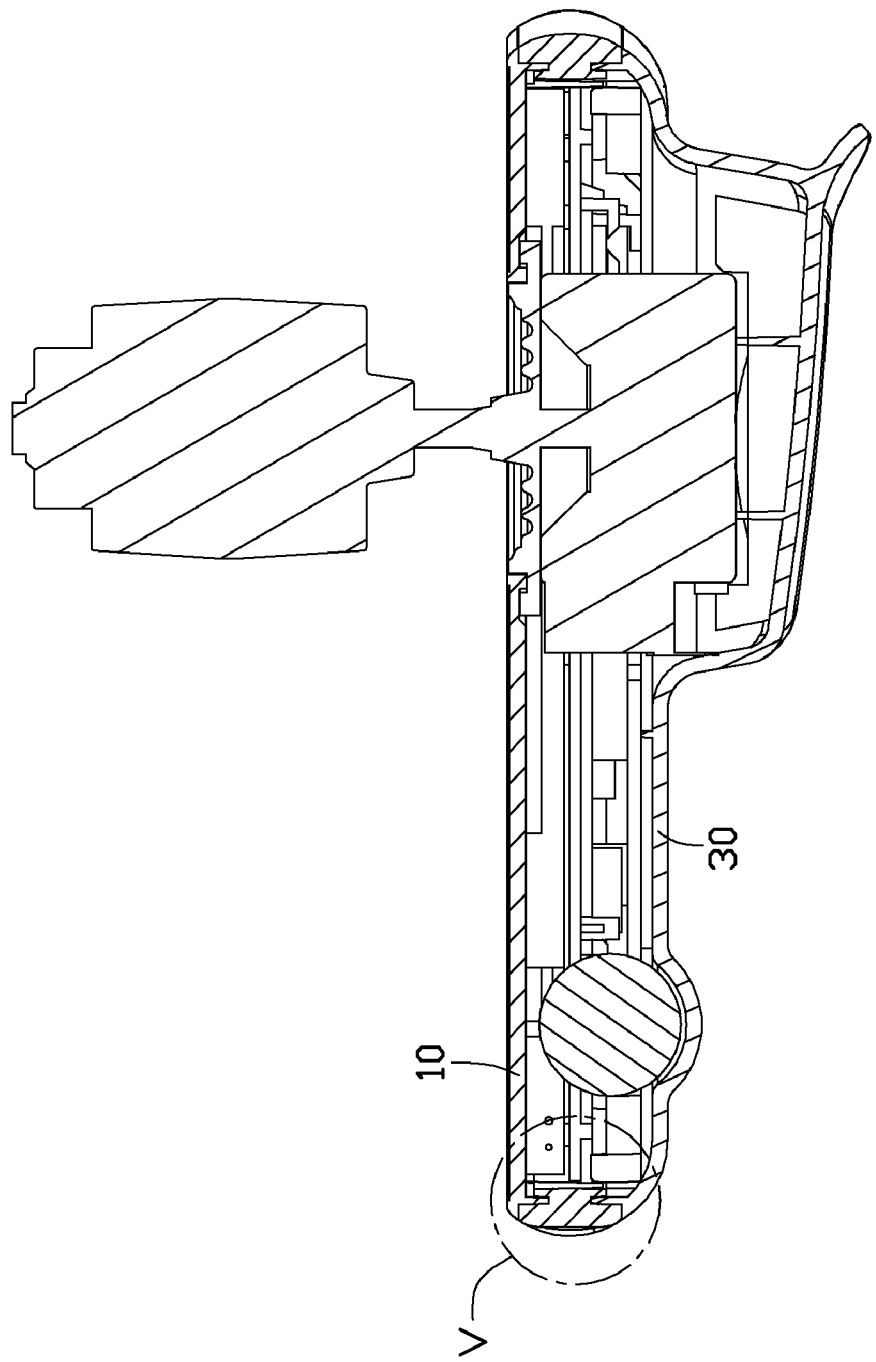
FIG. 4 is a cross-section of the electronic device of FIG. 1, taken along line IV-IV.
Figure 5:
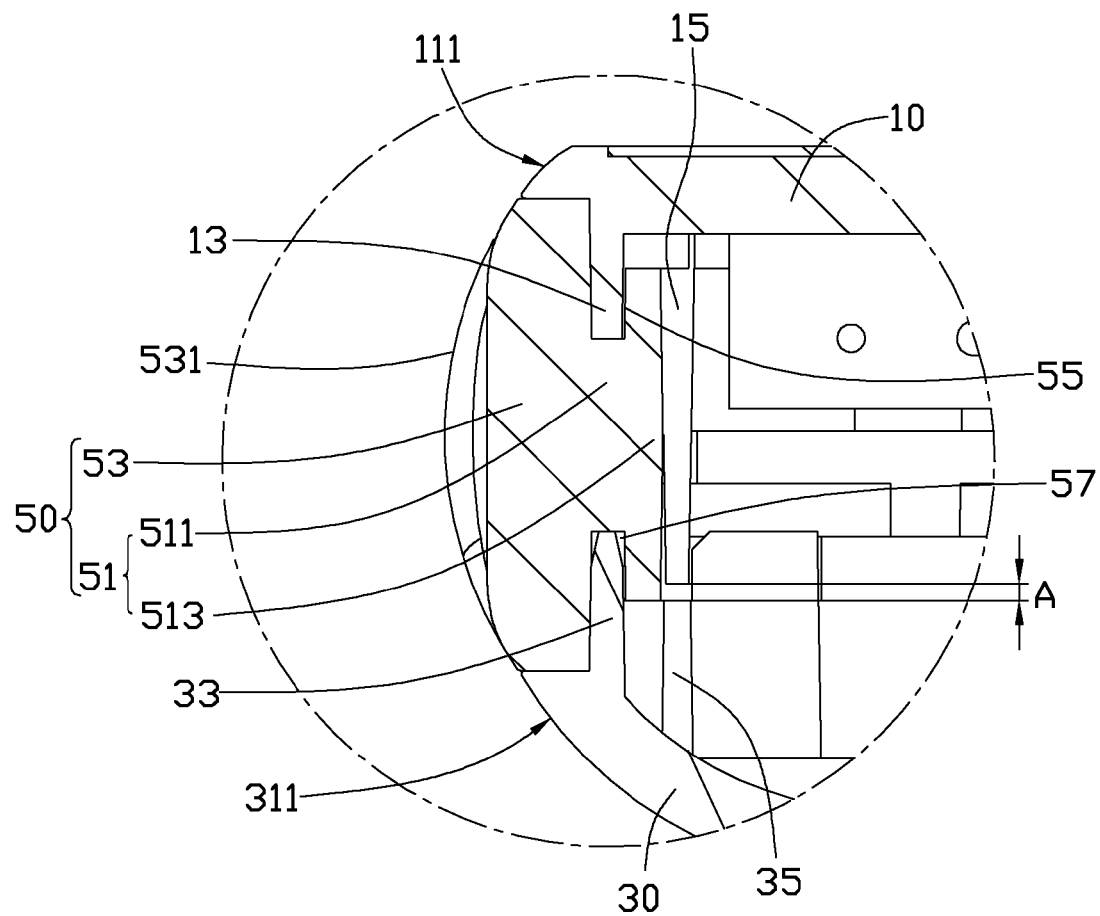
FIG. 5 is an enlarged view of a part V of FIG. 4.

Referring to FIGS. 2, 3 and 5, to assemble the electronic device 100, the first sidewall 13 of the first housing 10 is engaged in the first assembly groove 55 of the buffering member 50. The second sidewall 33 of the second housing 30 is engaged in the second assembly groove 57 of the buffering member 50. The positioning flange 513 of the first buffering portion 51 is engaged between the first sidewall 13 and the first engaging portion 15 of the first housing 10. After the first housing 10 is entirely engaged with the second housing 30, a gap A is formed between the first engaging portion 15 and the second engaging portion 35. A plurality of screws (not shown) extends through the threaded holes 313 of the second housing 30, and engages with the threaded holes of the first housing 10, thus firmly fixing the second housing 30 to the first housing 10.

After the electronic device 100 is assembled, the second buffering portion 53 of the buffering member 50 protrudes between a side of the first bottom wall 11 and the second bottom wall 31. If the electronic device 100 suffers a fall or shock, the second buffering portion 53 absorbs side collision forces applied on the electronic device 100, and the first buffering portion 53 absorbs frontal collision forces applied on the electronic device 10. The gap A between the first engaging portion 15 and the second engaging portion 35 ensures that the first housing 10 does not collide with the second housing 30. Therefore, the buffering member 50 can absorb the collision force from different directions, avoiding damage to the inner electronic components (not shown) of the electronic device 100. Furthermore, the first flange 111 of the first bottom wall 11, the second flange 311 of the second bottom wall 31, and the second buffering portion 53 have curved outer surfaces to smoothly connect with each other. Thus, the electronic device 100 has a pleasing appearance.

It should be pointed out that the buffering member 50 can be other shapes to fit the structure of first housing 10 and the second housing 30. For example, if the first housing 10 does not have the first engaging portion 15, the positioning flange 513 of the first buffering portion 51 can be omitted.

It is believed that the present embodiments and their advantages will be understood from the foregoing description, and it will be apparent that various changes may be made thereto without departing from the spirit and scope of the disclosure or sacrificing all of its material advantages.

What is claimed is:

1. An electronic device, comprising:
   a first housing comprising a first bottom wall and a first flange extending from the first bottom wall; a second housing comprising a second bottom wall and a second flange extending from the second bottom wall; and a buffering member positioned between the first housing and the second housing, wherein the buffering member comprises a first buffering portion and a second buffering portion; the first buffering portion is positioned between the first housing and the second housing, thereby separating the first housing from the second housing; the second buffering portion protrudes outwardly between the first flange and the second flange.

2. The electronic device of claim 1, wherein the first flange has a curved outer surface.

3. The electronic device of claim 2, wherein the second flange has a curved outer surface.

4. The electronic device of claim 3, wherein the first buffering portion comprises a connecting protrusion and a positioning flange, the connecting protrusion extending from a middle portion of the second buffering portion and the positioning flange being formed on an end of the connecting protrusion away from the second buffering portion.

5. The electronic device of claim 4, wherein the first buffering portion and the second buffering portion cooperatively define a first assembly groove; a first sidewall extends substantially perpendicularly from the first bottom wall; the first sidewall is engaged in the first assembly groove.

6. The electronic device of claim 5, wherein the first buffering portion and the second buffering portion further cooperatively define a second assembly groove; a second sidewall extends substantially perpendicularly from the second bottom wall; the second sidewall is engaged in the second assembly groove.

7. The electronic device of claim 4, wherein a first engaging portion extends from the first bottom wall adjacent to the first sidewall, and the positioning flange is positioned between the first engaging portion and the first sidewall.

8. The electronic device of claim 4, wherein a second engaging portion extends from the second bottom wall adjacent to the second sidewall, and the second engaging portion is separated from the first engaging portion.

9. The electronic device of claim 1, wherein the buffering member is made of an elastic material.

10. The electronic device of claim 9, wherein the buffering member is made of soft plastic.

11. The electronic device of claim 1, wherein the second buffering portion has a curved outer surface smoothly connecting with the first housing and the second housing.

12. The electronic device of claim 1, wherein the buffering member is annular and encircling the first housing and the second housing.

* * * * *